United States Patent [19]

Satou

[11] Patent Number: 5,525,841
[45] Date of Patent: Jun. 11, 1996

[54] POWER GAAS FET HAVING INTERNAL MATCHING CIRCUIT

[75] Inventor: Kouji Satou, Yamagata, Japan

[73] Assignee: NEC Corporation, Japan

[21] Appl. No.: 392,035

[22] Filed: Feb. 22, 1995

[30] Foreign Application Priority Data

Feb. 22, 1994 [JP] Japan .................................. 6-022978

[51] Int. Cl.⁶ ............................................. H01L 23/544
[52] U.S. Cl. ............................................ 257/797; 257/786
[58] Field of Search .................................... 257/797, 786

[56] References Cited

FOREIGN PATENT DOCUMENTS

| 1278735 | 11/1989 | Japan | .................................. 257/797 |
| 2-268004 | 11/1990 | Japan . | |
| 4129259 | 4/1992 | Japan | .................................. 257/797 |

*Primary Examiner*—Mark V. Prenty
*Attorney, Agent, or Firm*—Ostrolenk, Faber, Gerb & Soffen

[57] ABSTRACT

A semiconductor device having a combining/distributing circuit includes a bonding region, an external lead, and an alignment marker provided to the combining/distributing circuit. The bonding region includes a predetermined high frequency branching point of the combining/distributing circuit. The external lead is coupled to the bonding region by bonding wires. The alignment marker makes a precise alignment between the bonding region and the external lead. The marker may be in the form of two slits which are provided at a corresponding edge portion of the bonding region of the combining/distributing circuit and which are spaced with each other in a distance corresponding to the width of the external lead. The precise alignment between the bonding region and the external lead eliminates a possibility of the occurrence of phase rotation resulting in the enhancement of output power characteristics and yield of products.

4 Claims, 3 Drawing Sheets

5,525,841

POWER GAAS FET HAVING INTERNAL MATCHING CIRCUIT

BACKGROUND OF THE INVENTION (1) Field of the Invention

The present invention relates to a semiconductor device, and more particularly to a high frequency power GaAs Schottky Barrier Field Effect Transistor (hereinafter referred to as "P-GaAs FET") having an internal matching circuit.

(2) Description of the Related Art

A conventional P-GaAs FET of the kind to which the present invention relates is disclosed in, for example, Japanese Patent Application Kokai Publication No. Hei 2-268004, wherein a plurality of GaAs FET chips are combined in a package and an internal matching circuit is provided for matching an input/output impedance to 50Ω. The internal matching circuit is constituted by a concentrated constant matching circuit and a distributed constant matching circuit, the concentrated constant matching circuit being for impedance matching of individual chips and consisting of a chip capacitor and a bonding wire inductance, and the distributed constant matching circuit being for combining/distributing power in a plurality of chips formed on an alumina substrate. The distributed constant matching circuit is connected, at its connecting portion, with an external input/output lead by bonding wires.

Conventionally, for making alignment with the external lead, the connecting portion of the distributed constant matching circuit is provided with a bonding tab which is a projected tab pattern for the bonding wires to be fixed there.

The conventional semiconductor device described above is shown in a plan view in FIG. 1A, and in a sectional view in FIG. 1B, the sectional view having been taken along line 1B—1B in FIG. 1A. This conventional semiconductor device comprises a package 1 for housing therein the entire structure of semiconductor device, an alumina substrate 2 in which the combining/distributing circuit 3 for input/output power is formed, a chip capacitor 4 for the concentrated constant circuit, a plurality of GaAs FET chips 5, an external lead 6, and a plurality of bonding wires 7 for electrically interconnecting the external lead 6 and the combining/distributing circuit 3.

FIG. 2 is a partially broken and exposed plan view showing the details of the connecting portion at which the substrate 2 and the external lead 6 are connected. The device has a bonding tab 8 which is precisely aligned with a branching point 31 at which the high frequency is balanced and by which the external lead 6 is coupled, by the bonding wires 7, to two transmission paths which are symmetrical between the combining and the distributing portions of the combining/distributing circuit 3 formed on the substrate 2.

As to the dimensions of the bonding tab, the width thereof is normally the same as that of the external lead 6, and the projection from the outer edge disposed at the branching point 31 of the combining/distributing circuit 3 is in the order of 0.3~0.5 mm.

During the fabrication of the above conventional semiconductor device, first the external lead 6 and the bonding tab 8 are aligned and are housed in the package 1. Then, the external lead 6 and the bonding tab 8 are interconnected by the bonding wires 7. In this way, the external lead 6 and the combining/distributing circuit 3 are assembled in a precise alignment.

Now, the function of the bonding tab 8 is explained. If the bonding tab 8 does not exist, in the absence of any alignment marker for the branching point 31 in the combining/distributing circuit 3, it is difficult, during the fabrication process, to make alignment in the branching direction (Y direction in FIG. 2) between the external lead 6 and the combining/distributing circuit 3. If the alignment is incomplete or unsatisfactory, the true branching point of the combining/distributing circuit 3 is unbalanced with respect to the inherent high frequency branching point 31, so that the combining and distributing of the transmission power becomes inaccurate resulting in the lowering of gain and output power characteristics. The provision of the bonding tab 8 ensures that the branching point 31 and the actual branching point are easily and accurately aligned in the direction of the branching, and the causes for defective products due to the above described unbalancing are removed.

However, since the bonding tab 8 described above projects from the transmission path of the combining/distributing circuit 3, the transmission path extends by the length of the projection in the direction from the branching point 31 to the external lead 6 (X direction in FIG. 2). Generally, the P-GaAs FET of the kind described above is designed so as to be impedance-matched with a transmission path of 50Ω. Thus, the branching point impedance at the design frequency of the branching point 31 differs from the 50Ω impedance of the transmission path to be connected externally when one considers the differences in the inductance of the bonding wire 7 and in the respective dielectric constants of the substrate 2 and the package 1 which the external lead 6 passes through. Therefore, at the connecting point on the bonding tab 8, there arises a phase rotation corresponding to the length of the extension of the transmission path, and this results in a deviation from the design value of the branching point impedance.

In the conventional semiconductor device described above, due to the phase rotation resulting from the transmission path extension corresponding to the length of the bonding tab provided for aligning and connecting the combining/distributing circuit with the external lead, the impedance at the branching point deviates from the design value, and this leads to defective products because of deterioration of output power characteristics and gain characteristics, and to the lowering of yield of products.

SUMMARY OF THE INVENTION

An object of the invention, therefore, is to overcome the problems existing in the prior art and to provide a semiconductor device in which the characteristics of an internal matching circuit are enhanced, and the size of an element mounting substrate can be reduced.

According to one aspect of the invention, there is provided a semiconductor device having an internal matching circuit which includes a combining/distributing circuit for combining and distributing power for input/output of a plurality of chips of a GaAs FET and for matching input/output impedance with a predetermined value, the semiconductor device comprising:

a bonding region which includes a predetermined high frequency branching point of the combining/distributing circuit;

an external lead which is coupled to the bonding region by bonding wires; and a marker which is provided to the combining/distributing circuit for making a precise alignment between the bonding region and the external lead during fabrication.

In the semiconductor device according to the invention, since the alignment marker is provided to the combining/distributing circuit for the alignment of the bonding region with the external lead, which eliminates a possibility of the occurrence of phase rotation caused by extension of the transmission path, the lowering of the gain and output power characteristics can be prevented, resulting in the enhancement of the yield of products.

Also, since the projected bonding tab is not required in the device according to the invention, the alumina substrate can be scaled down by the length corresponding to the otherwise-required projection, and this enables the scaling down of the internal matching circuit and the cost down of the device.

BRIEF DESCRIPTION OF THE DRAWINGS

The above and other objects, features and advantages of the present invention will be apparent from the following description of a preferred embodiment of the invention explained with reference to the accompanying drawings, in which.

PREFERRED EMBODIMENT OF THE INVENTION

Figure 1A:
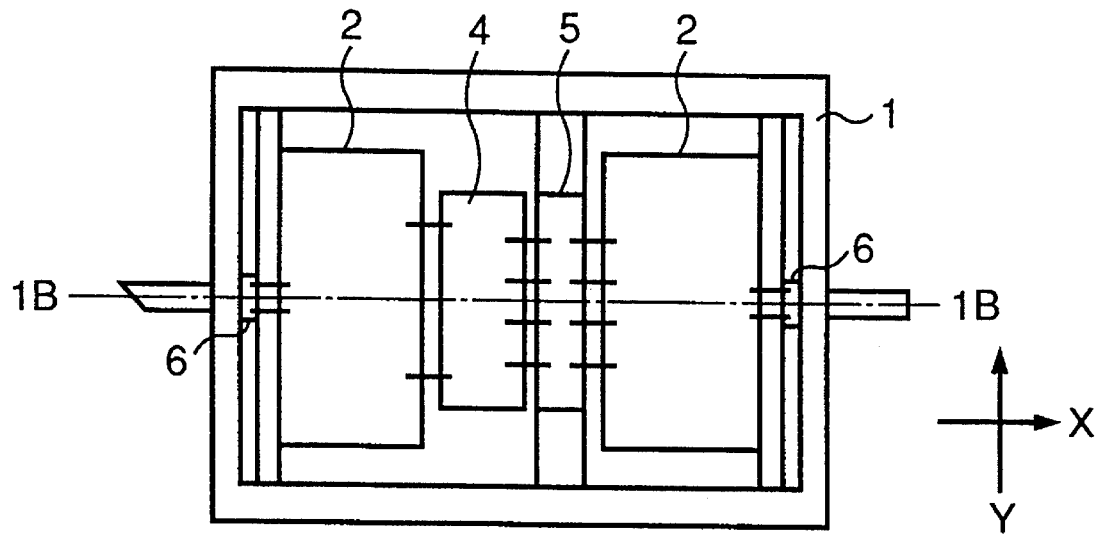
FIGS. 1A and 1B are diagrams for showing a conventional semiconductor device, FIG. 1A being a plan view thereof and FIG. 1B being a sectional view taken along line 1B—1B in FIG. 1A.
Figure 1B:
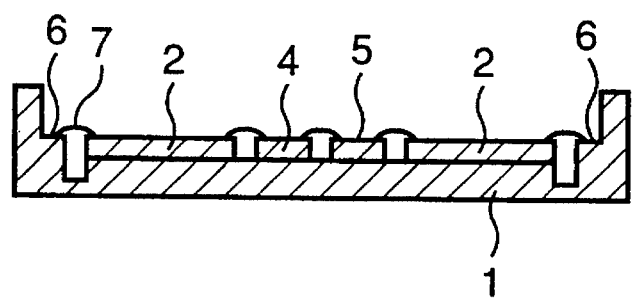
Figure 2:
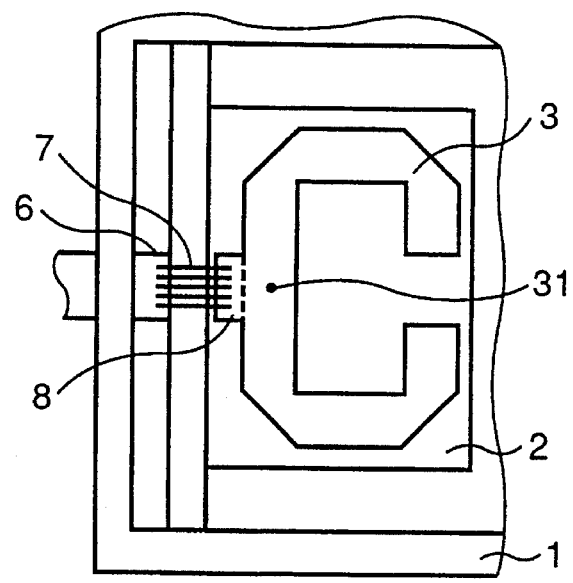
FIG. 2 is a partially broken and exposed plan view of the conventional semiconductor device, showing details of the portion at which a substrate and an external lead are interconnected.

Now, a preferred embodiment of the invention is explained with reference to the drawings.

In the explanation, the same or similar reference numerals or symbols represent the same or similar elements all through the drawings. In the semiconductor device of the embodiment according to the invention shown in FIG. 3, instead of the combining/distributing circuit 3 of the conventional device, there is provided a combining/distributing circuit 3A having two slits 33A and 33B for aligning purposes, which are spaced with each other in essentially the same distance as the width of an external lead 6 and in line symmetry in the Y axis direction with respect to the branching point 31. The combining/distributing circuit 3A is constituted by a microstrip line formed on a dielectric substrate 2.

In place of the bonding tab 8 of the conventional device, there are provided bonding wires 7 which are directly connected to a bonding region 32 (shown by dotted lines) which includes the branching point 31 of the combining/distributing circuit 3A.

Figure 3:
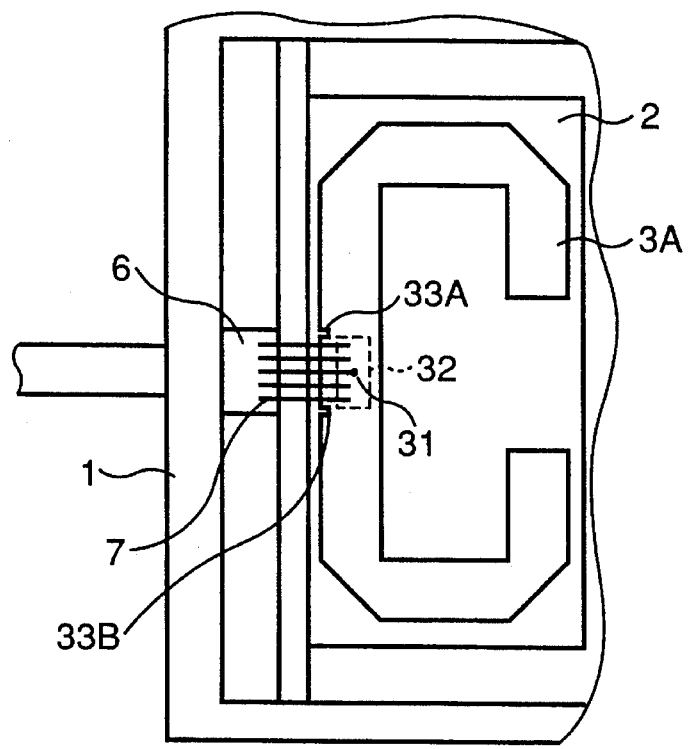
FIG. 3 is a partially broken and exposed plan view of a semiconductor device of the embodiment according to the invention.

Now, the operation of the device of the embodiment according to the invention is explained with reference to FIG. 3. First, during the fabrication of the device of the embodiment, the two edges of the external lead 6 and the slits 33A and 33B are respectively brought to alignment, and the substrate 2 is mounted at a predetermined location of a package 1. Then, the external lead 6 and the bonding region 32 are interconnected by bonding wires 7. In this way, the external lead 6 and the combining/distributing circuit 3A can be assembled in an accurately aligned state. The dimensions of the slits 33A and 33B are desirably as small as possible so that the transmission characteristics of the combining/distributing circuit 3A are not adversely affected. In the device of the present embodiment, each slit is a 50 µm rectangle which corresponds essentially to a minimum dimension of the patterning of the combining/distributing circuit 3A.

By the above arrangement, it is possible to eliminate any incomplete alignment between the external lead 6 and the combining/distributing circuit 3A that may cause the lowering of the gain and output power characteristics and any phase rotation that may result from the extension of the transmission path due to the involvement of a bonding tab 8 as in the conventional arrangement. That is, there will be no lowering of the gain and output power characteristics caused by deviation of the impedance from the designed value, so that the yield of products can be enhanced.

Figure 4A:
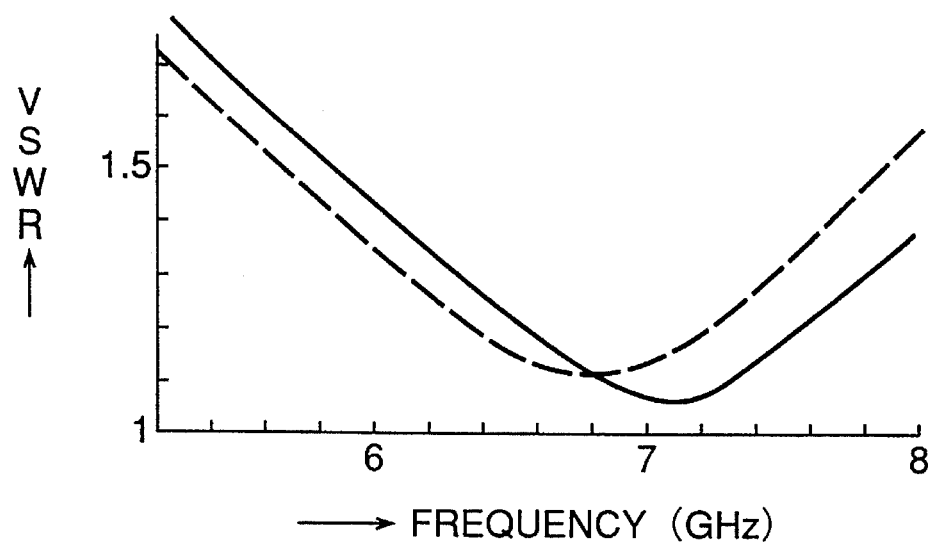
FIGS. 4A and 4B are graphs showing examples of comparison by calculated values respectively of the virtual standing wave ratio (VSWR) characteristics and the transmission loss characteristics of the semiconductor circuit of the embodiment according to the invention (shown by solid lines) and those according to the conventional technique (shown by dotted lines).
Figure 4B:
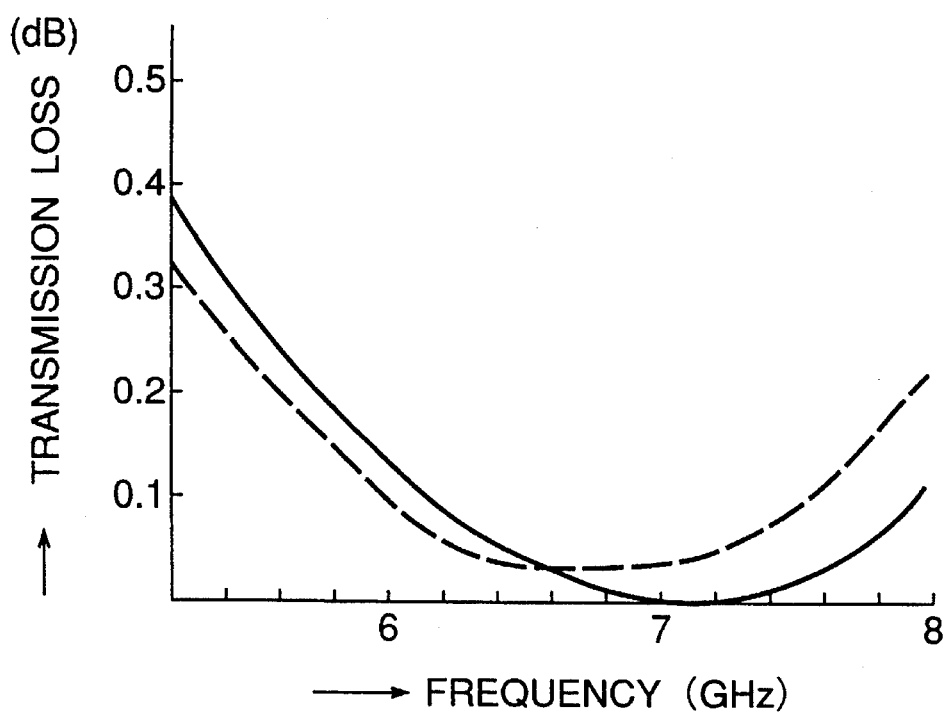

FIGS. 4A and 4B show examples of comparison by calculated values respectively of the virtual standing wave ratio (VSWR) characteristics and the transmission loss characteristics of the semiconductor circuit of the embodiment according to the invention (shown by solid lines) and those according to the conventional technique (shown by dotted lines). It is shown that, whereas the VSWR in the conventional device is 1.15 with respect to the designed frequency of 7.1 GHz, that in the device of the embodiment according to the invention is 1.05, which is an improvement by 0.3 dB when converted to transmission losses. With regard to the transmission loss, whereas, in the conventional device, the center frequency is lowered by 0.3 GHz with respect to the designed frequency of 7.1 GHz, it is shown that such a deviation does not exist in the embodiment according to the invention.

Furthermore, the device according to the invention does not require the bonding tab that was necessary in the device according to the conventional technique, and this enables a reduction in the size of the substrate by 0.3–0.5 mm which corresponds to the length of the projected tab, a miniaturization of the internal matching circuit, and a 10% reduction costs.

While the invention has been described in its preferred embodiment, it is to be understood that the words which have been used are words of description rather than limitation and that changes within the purview of the appended claims may be made without departing from the true scope of the invention in its broader aspects. For example, the two slits provided as the alignment marker in the embodiment may be replaced by two projections, and such a change may be made without departing from the scope of the claimed invention.

What is claimed is:

1. A semiconductor device having an internal matching circuit which includes a combining/distributing circuit for combining and distributing power for input/output of a plurality of chips of a GaAs FET and for matching input/output impedance with a predetermined value, said semiconductor device comprising:

a bonding region which includes a predetermined high frequency branching point of said combining/distributing circuit;

an external lead which is coupled to said bonding region by bonding wires; and a marker which is provided to said combining/distributing circuit for making a precise alignment between said bonding region and said external lead during fabrication said marker comprising two slits which are provided at a corresponding edge portion of said bonding region in said combining/distributing circuit and which are spaced with each other in a distance corresponding to the width of said external lead.

2. The semiconductor device according to claim 1, wherein said bonding wires are bonded directly to said bonding region.

3. The semiconductor device according to claim 1, wherein said bonding region includes, within said bonding region, a branching point of said combining/distributing circuit.

4. The semiconductor device according to claim 3, wherein said bonding wires are bonded directly to said bonding region.

* * * * *

UNITED STATES PATENT AND TRADEMARK OFFICE
CERTIFICATE OF CORRECTION

PATENT NO. :     5,525,841
DATED      :     June 11, 1996
INVENTOR(S):     Kouji Satou It is certified that error appears in the above-identified patent and that said Letters Patent is hereby corrected as shown below:

Column 1, line 1 and

On the title page, at item [54], the title "POWER GAAS FET HAVING INTERNAL MATCHING CIRCUIT" should read --POWER GaAs FET HAVING INTERNAL MATCHING CIRCUIT--

Signed and Sealed this

Twenty-fourth Day of September, 1996

Attest:

BRUCE LEHMAN

*Attesting Officer*     *Commissioner of Patents and Trademarks*